United States Patent [19]
Chalmers

[11] 4,257,660
[45] Mar. 24, 1981

[54] ELECTRIC CONNECTOR HAVING A PLURALITY OF IN-LINE CONTACTS

[75] Inventor: Walter M. Chalmers, Dundee, Scotland

[73] Assignee: Ferranti Limited, Hollinwood, United Kingdom

[21] Appl. No.: 58,133

[22] Filed: Jul. 17, 1979

[30] Foreign Application Priority Data

Jul. 18, 1978 [GB] United Kingdom .............. 30205/78

[51] Int. Cl.$^3$ ........................ H01R 13/62; H05K 1/07
[52] U.S. Cl. .................................................. 339/74 R
[58] Field of Search ......... 339/74 R, 75 MP, 176 MP

[56] References Cited

U.S. PATENT DOCUMENTS

| | | | |
|---|---|---|---|
| 3,426,313 | 2/1969 | Wycheck | 339/74 R |
| 3,464,054 | 8/1969 | Mansfield | 339/176 MP |
| 3,990,761 | 11/1976 | Jayne | 339/74 R |

OTHER PUBLICATIONS

IBM Bulletin, Brearley et al, vol. 13, No. 9, p. 2590, Feb. 1971.

*Primary Examiner*—Neil Abrams
*Attorney, Agent, or Firm*—Kerkam, Stowell, Kondracki & Clarke

[57] ABSTRACT

An electric connector comprises a housing (10) having a base (11) and two side walls (12, 13) together defining a longitudinal slot (14) into which a plug member may be inserted. A plurality of projecting walls (15) define a number of transverse openings (16) extending from the longitudinal slot (14), and each of these openings contains an electrically-conducting contact member (17). Each contact member has a terminal portion (18) extending out of the base (11) of the housing (10), a contact portion (19) which may extend into the longitudinal slot (14) and an actuating portion (20).

The contact members (17) may be retracted out of the longitudinal slot (14) by an actuating tool comprising a pair of arms (25) which engage with the side walls (12, 13) and, when moved in a direction parallel to the longitudinal slot (14) engage with the actuating portions (20) of all the contact members (17). The front edges of each arm (25) is provided with a ramp (26) to provide gradual engagement.

1 Claim, 5 Drawing Figures

ELECTRIC CONNECTOR HAVING A PLURALITY OF IN-LINE CONTACTS

This invention relates to electric connectors, and particularly to such connectors having a plurality of in-line contacts. Such connectors are used particularly, though not exclusively, for providing connections to printed circuit boards. They may have one or two rows of contacts, and each row may contain 90 or more contacts. If, for example, a connector has two rows each having 90 contacts then the force required to insert a board or plug into the connector is considerable.

In order to overcome this problem connectors have been made which include means for causing the contacts to be moved away from the board position whilst the board is being inserted or removed, the contacts then being moved back into position to effect the desired electrical connections. Whilst this does not provide the same degree of wiping action sometimes relied on to keep the co-operating surfaces clean, the insertion force problem is thus overcome. Several types of actuating mechanism are described in a paper by R. Cobaugh and A. Taylor entitled "A New Zero-Insertion-Force Card-Edge Connector" appearing at pages 398 to 403 of the Proceedings of the Ninth Annual Connector Symposium, 1976.

The mechanisms described in that paper include rotary and linear cams. A different mechanism is described in our published British patent application No. 2,022,329A It is an object of the invention to provide an electric connector having retractable in-line contacts.

According to the present invention there is provided an electric connector which includes a housing of electrically-insulating material having a base and two side walls together defining a longitudinal slot from which extend a plurality of transverse openings, and a plurality of electrically-conducting contact members located one in each of at least some of the transverse openings, each contact member comprising a terminal portion arranged to extend from the base of the housing, a contact portion arranged to project into the longitudinal slot, and an actuating portion extending from the end of the contact portion remote from the terminal portion, the actuating portions of all the contact members located in transverse openings on the same side of the longitudinal slot being in line and parallel with one another such that they may be displaced to withdraw the contact portions of the contact members from the longitudinal slot by means of a removable actuating tool arranged to engage with the housing.

The contact portions of contact members on opposite sides of the longitudinal slot may be withdrawn by the use of separate actuating tools. Alternatively the two separate actuating tools may be connected together at one end to form a single actuating tool.

An embodiment of the invention will now be described with reference to the accompanying drawings, in which.

Figure 1:
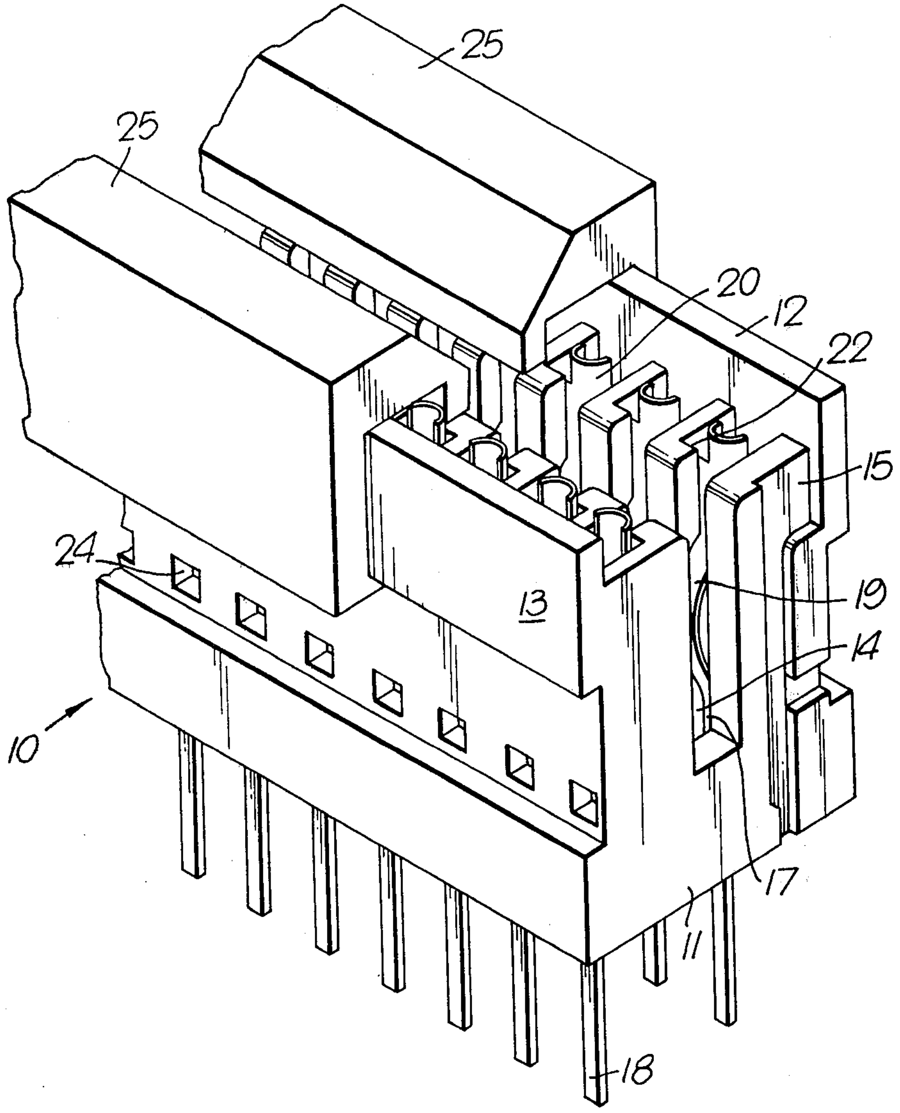
FIG. 1 is an isometric view of part of a connector showing a double actuating tool in use.

Referring now to the drawings, the connector comprises a housing 10 moulded from an electrically-insulating material and comprising a base 11 and two side walls 12 and 13 which together define a longitudinal slot 14. Extending from each side of the slot and defined by projecting walls 15 are a plurality of transverse openings 16, each of which contains, or may contain, an electrically-conducting contact member 17. The projecting walls 15 are shorter than walls 12 or 13 from which they extend. Each contact member comprises a terminal portion 18, which extends through the base 11 of the housing for connection to an external circuit, a contact portion 19, and an actuating portion 20 which extends from the contact portion 19. The actuating portion 20 projects above the top of projecting walls 15. At the point where the actuating portion 20 and contact portion 19 meet is formed a tab 21, which engages with a face 22 on each projecting wall 15 to limit the movement of the contact member into the longitudinal slot 14.

Figure 4:
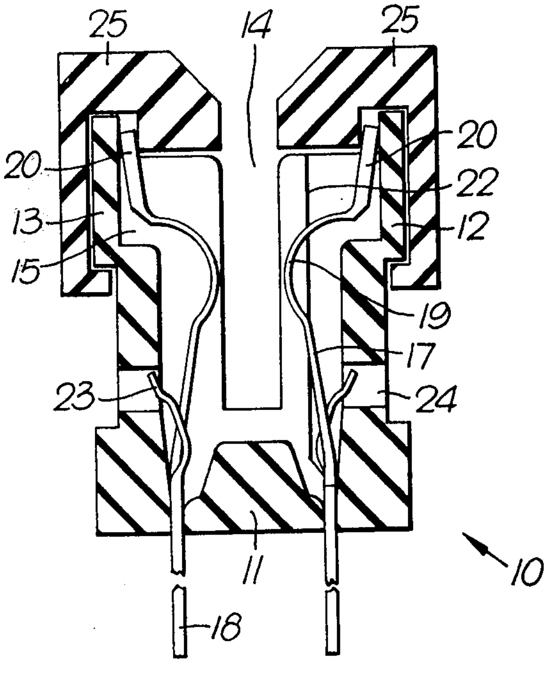
FIG. 4 is a sectional view along the line 4—4 of FIG. 2.
Figure 3:
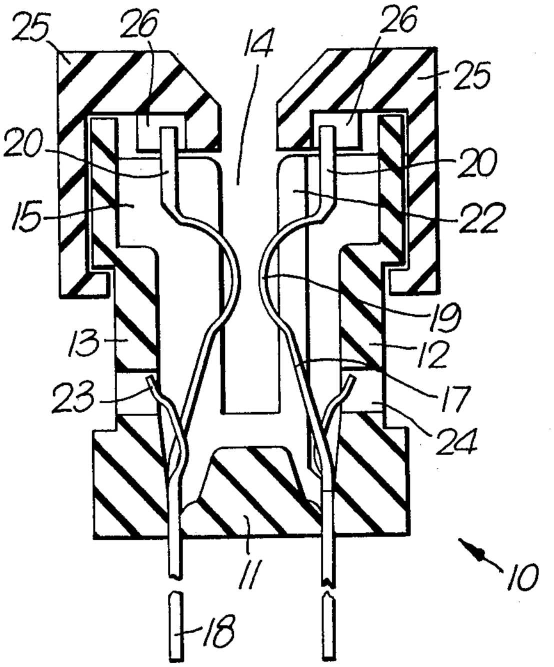
FIG. 3 is a sectional view along the line 3—3 of FIG. 2.
Figure 5:
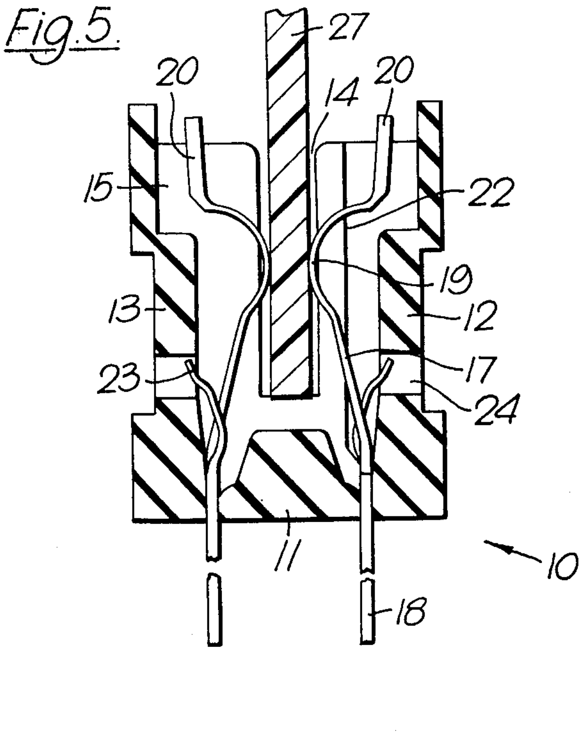
FIG. 5 is a view similar to that of FIG. 4 with a printed circuit board in position in the connector with the actuating tool removed.

FIGS. 3 to 5 show how the contact member 17 are retained in position in the housing 10 of the connector by means of barbs 23 which spring into apertures 24 in the housing.

Figure 2:
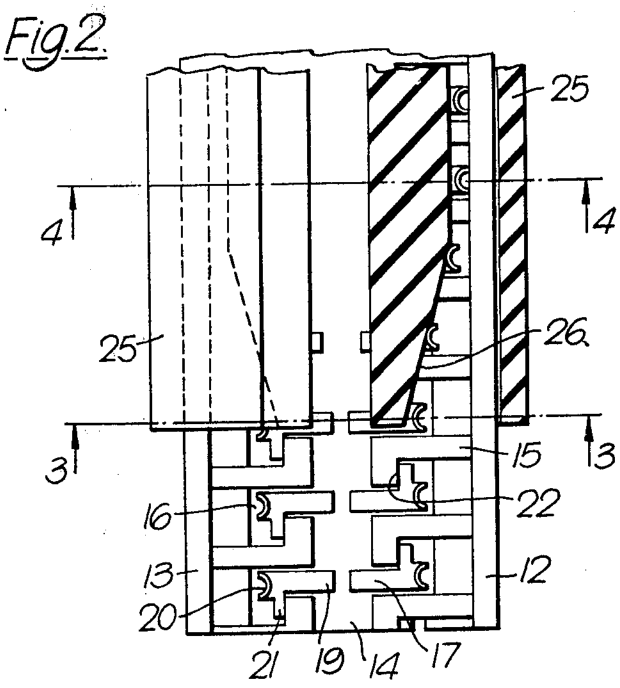
FIG. 2 is a part-sectioned plan view of the connector of FIG. 1.

The contact members 27 are retracted by means of an actuating tool shown in FIGS. 1 and 2. The tool comprising a moulding in the form of two shaped arms 25 joined together at one end (not shown) and arranged to fit over the upper surface of the housing 10 and around part of the side walls 12 and 13. The two arms are separated by a distance at least equal to the width of the longitudinal slot 14 in the housing. Each arm is formed with an internal ramp 26, shown in FIG. 2.

It will be seen from FIGS. 1 and 2 that as the arms 25 of the actuating tool are moved over the housing 10, the ramp 26 on each arm engages with the actuating portions 20 of successive contact members 17 and force these portions to the rear of their longitudinal recesses away from the longitudinal slot 14. FIG. 3 shows a view of the connector with the actuating tool about to be inserted. The contact members 17 are positioned by their natural resilience so that the contact portion 19 of each extends into the longitudinal slot 14. The engagement between tab 21 on each contact member and the face 22 of each projecting wall 15 prevents opposite contact members from touching. The ramp 26 on each arm 25 of the actuating tool is about to engage the actuating portion 20 of each contact member 17.

As the actuating tool is inserted each contact member is moved away from the longitudinal slot 14. FIG. 4 shows a view of the connector when each contact member has been retracted so that its contact portion 19 is clear of the longitudinal slot 14. With the contact members in this portion a printed circuit board or other plug member may be inserted into the longitudinal slot 14, either from above or from either end of the connector.

After the insertion of a board or plug member the actuating tool is withdrawn, allowing the contact portions 19 of the contact members 17 to engage with the board or plug 27 as shown in FIG. 5.

The connector and the actuating tool described above may be modified in a number of ways. Not all the contact positions in the housing need be occupied by contact members, and any suitable shape of contact may be used. Equally, any suitable means may be used for retaining the contact in position.

What we claim is:

1. An electric connector which includes a housing of electrically-insulating material having a base and two side walls together defining a longitudinal slot from which extend a plurality of transverse openings, and a plurality of electrically-conducting contact members located one in each of at least some of the transverse openings, each contact member comprising a terminal portion arranged to extend from the base of the housing, a contact portion arranged to project into the longitudinal slot, and an actuating portion extending from the end of the contact portion remote from the terminal portion, the actuating portions of all the contact members located in transverse openings on the same side of the longitudinal slot being in line and parallel with one another such that they may be displaced to withdraw the contact portions of the contact members from the longitudinal slot, the transverse openings of the housing located on one side of the longitudinal slot being separated from one another by projecting walls extending from the corresponding side walls, and in which each contact member includes a projecting tab on each contact member arranged to engage a face of the associated projecting wall and a removable actuating tool for engaging the actuating portions and engaging the housing in which each projecting wall is shorter than the corresponding side wall of the housing, the actuating portion of each contact member extending into the region between the top of a projecting wall and the top of a side wall, said actuating tool engaging said contact portion within said region and being movable in a direction parallel to said longitudinal slot to cause all contact portions on one side of said slot to be retracted from said slot.

* * * * *